United States Patent
Chen

(10) Patent No.: US 8,735,742 B2
(45) Date of Patent: May 27, 2014

(54) SHIELDING APPARATUS AND CABINET WITH SAME

(75) Inventor: Tsung-Yuan Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 14 days.

(21) Appl. No.: 13/553,836

(22) Filed: Jul. 20, 2012

(65) Prior Publication Data

US 2014/0008118 A1 Jan. 9, 2014

(30) Foreign Application Priority Data

Jul. 6, 2012 (TW) .............................. 101124355 A

(51) Int. Cl.
*H05K 9/00* (2006.01)

(52) U.S. Cl.
USPC .......................................... 174/378; 174/382

(58) Field of Classification Search
USPC ................... 174/377, 378, 380, 382; 361/818
See application file for complete search history.

(56) References Cited

U.S. PATENT DOCUMENTS

| | | | | |
|---|---|---|---|---|
| 4,980,564 A | * | 12/1990 | Steelmon | 250/505.1 |
| 5,097,885 A | * | 3/1992 | Kitagawa | 160/84.01 |
| 6,068,009 A | * | 5/2000 | Paes et al. | 135/117 |
| 7,233,012 B2 | * | 6/2007 | Zyromski et al. | 250/493.1 |
| 2006/0254815 A1 | * | 11/2006 | Humphrey et al. | 174/380 |
| 2012/0147582 A1 | * | 6/2012 | Liu | 361/818 |

* cited by examiner

*Primary Examiner* — Hung Ngo
(74) *Attorney, Agent, or Firm* — Novak Druce Connolly Bove + Quigg LLP

(57) ABSTRACT

A cabinet includes a chassis and an electromagnetic interference (EMI) shielding apparatus. The shielding apparatus includes a bracket installed to a first end of the chassis, a shaft rotatably installed in the bracket, and a shielding member reeled about the shaft. The shielding member includes a first end fixed to the shaft, and a second end opposite to the first end and forming a holder. A second end of the chassis forms a latch opposite to the bracket for engaging with the holder. The shielding member is made of EMI shielding material, and the shielding member is wound on or let out from the shaft as the shaft rotates.

11 Claims, 4 Drawing Sheets

SHIELDING APPARATUS AND CABINET WITH SAME

BACKGROUND

1. Technical Field

The present disclosure relates to a cabinet with an electromagnetic interference shielding apparatus.

2. Description of Related Art

A server cabinet usually has a number of servers installed therein. Each server includes a motherboard, a power supply, a plurality of hard disk drives, and other functioning modules. Ordinarily, an access of the cabinet is not covered with a cover, for expediently changing or repairing the functioning modules of the servers. However, this allows electromagnetic radiations to enter or leaks from the cabinet.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
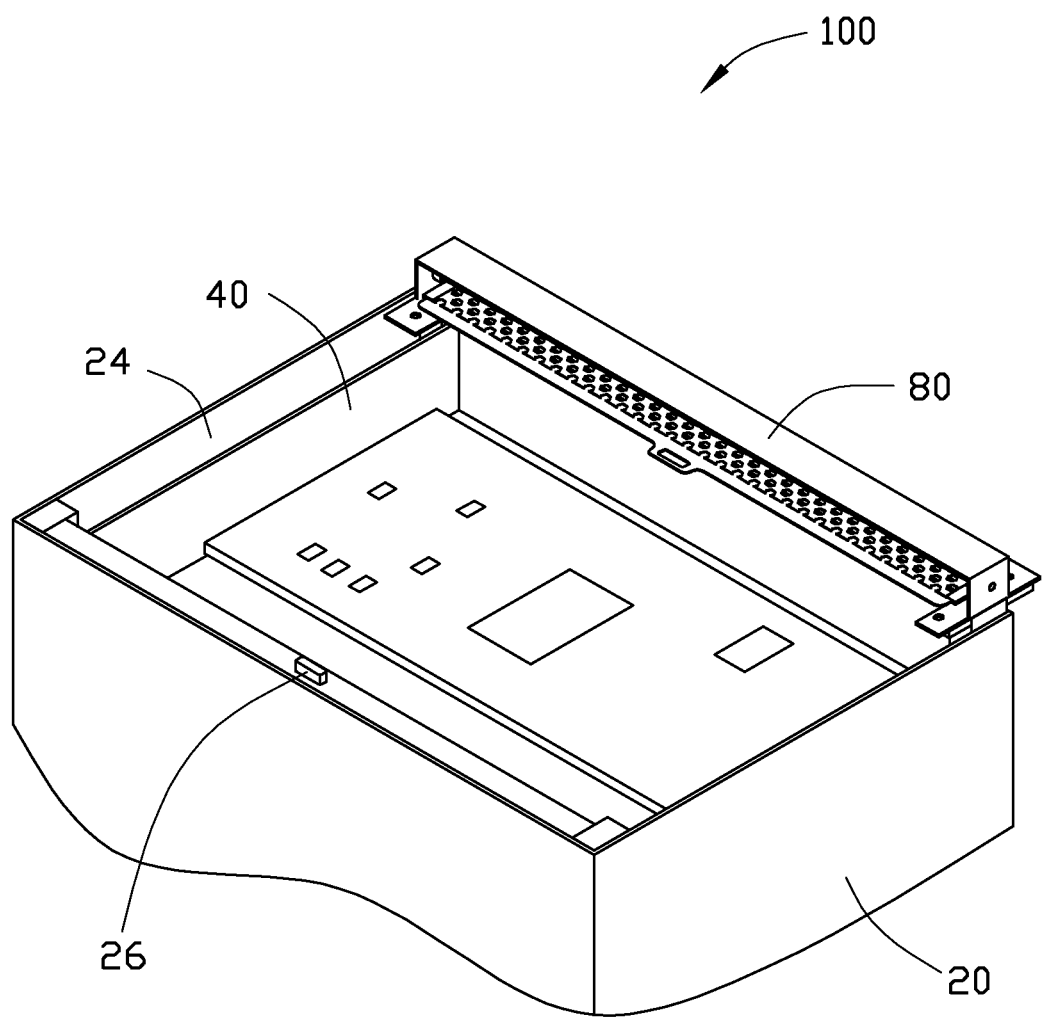
FIG. 1 is a partially isometric view of an exemplary embodiment of a cabinet, wherein the cabinet includes an electromagnetic interference (EMI) shielding apparatus.

Referring to FIG. 1, an exemplary embodiment of a cabinet 100 includes a chassis 20 and an electromagnetic interference (EMI) shielding apparatus 80. A plurality of servers 40 is received in the chassis 20. A top of the chassis 20 defines an opening 24. The EMI shielding apparatus 80 is mounted on a first side of the top of the chassis 20, adjacent to the opening 24. A latch 26 extends up from a second side of the top of the chassis 20, opposite to the EMI shielding apparatus 80.

Figure 2:
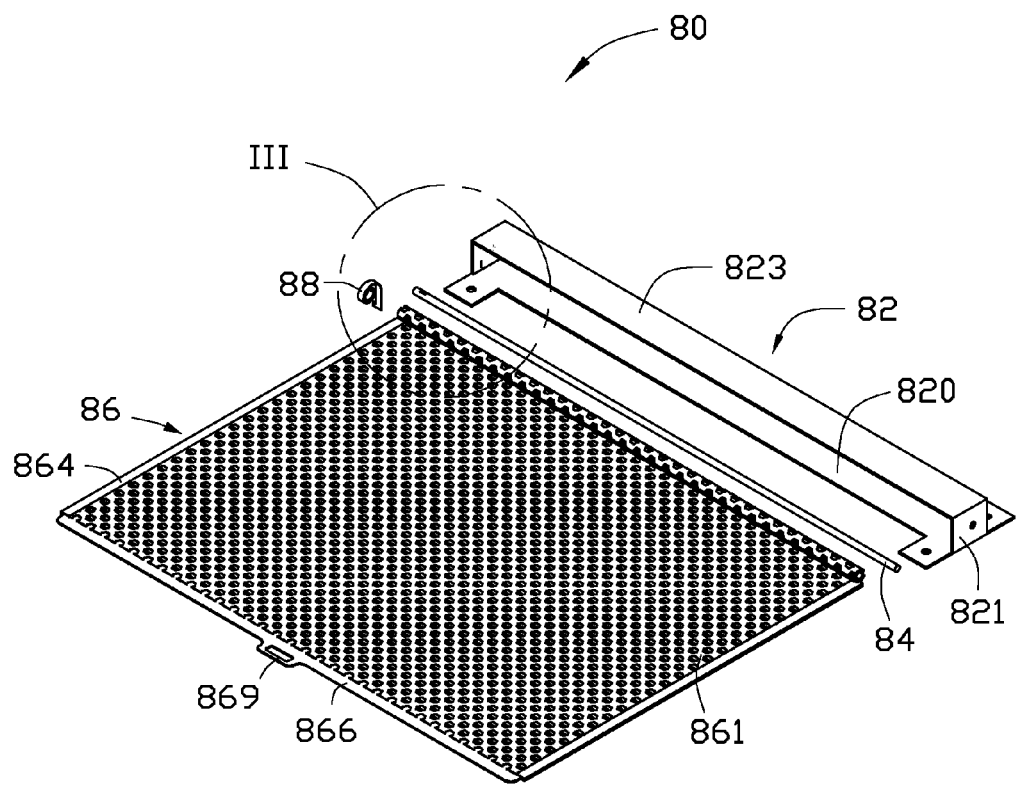
FIG. 2 is an exploded, isometric view of the EMI shielding apparatus of FIG. 1.
Figure 3:
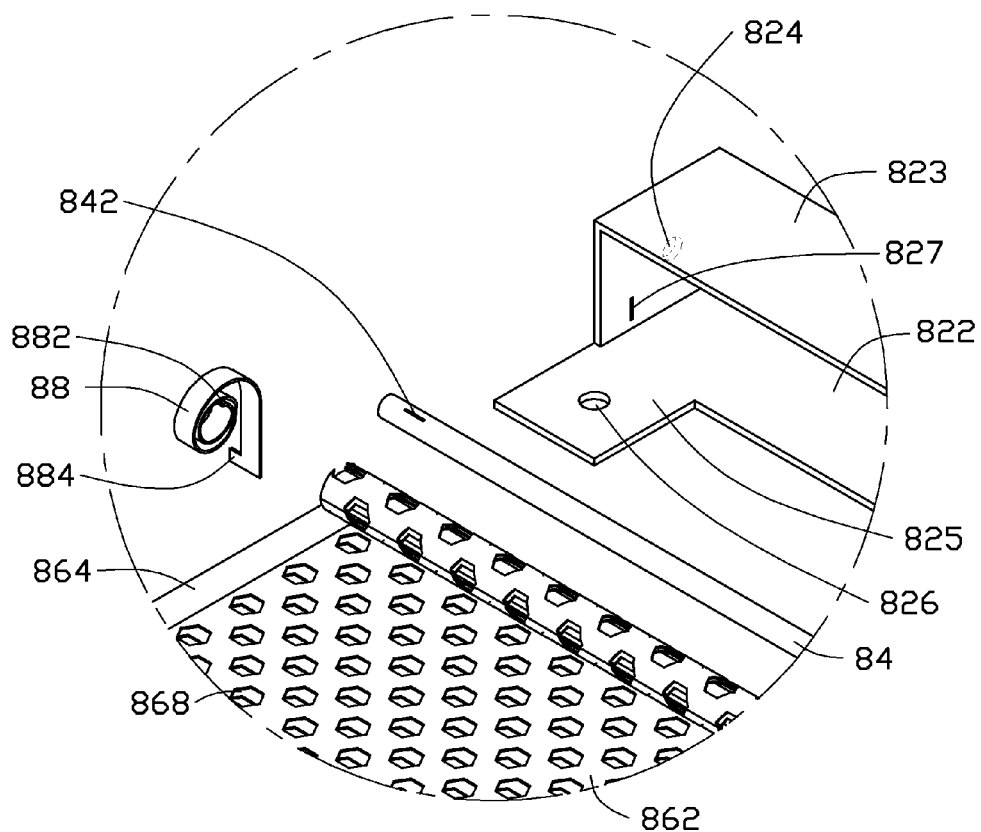
FIG. 3 is an enlarged view of the circled portion III of FIG. 2.

Referring to FIG. 2 and FIG. 3, the EMI shielding apparatus 80 includes a bracket 82, a shaft 84, a shielding member 86, and a resilient member 88.

The bracket 82 includes a rectangular bottom wall 820, a top wall 823 opposite to the bottom wall 820, and two end walls 821 respectively connected between opposite ends of the bottom wall 820 and the top wall 823. The bottom wall 820, the top wall 823, and the end walls 821 cooperatively bound a receiving space 822. The end walls 821 define two opposite shaft holes 824. One of the end walls 821 defines a latching hole 827 adjacent to the corresponding shaft hole 824. Two tabs 825 extend out from two opposite sides of each end of the bottom wall 820. The tabs 825 are coplanar with the bottom wall 820. Each tab 825 defines a through hole 826.

Two opposite ends of the shaft 84 can be rotatably inserted in the shaft holes 824. One of the ends of the shaft 84 defines a long positioning hole 842 extending along a lengthwise direction of the shaft 84.

The shielding member 86 includes a rectangular shielding portion 861, two rims 864 made of aluminum foil and extending from two opposite sides of the shielding portion 861, and a positioning bar 866 extending from a first end of the shielding portion 861. A holder 869 extends out from a middle of the positioning bar 866. In the embodiment, the shielding portion 861 includes two shielding pieces 862 overlapped with each other. A plurality of through holes 868 is defined in each shielding piece 862, and is misaligned from the through holes 868 of the other shielding piece 862. The shielding piece 862 is made of EMI shielding material, such as copper, or steel. In another embodiment, the shielding portion 861 can also include a shielding piece made of shielding material. The shielding piece defines a plurality of through holes, or is a shielding mesh made of electric cable, or is a double deck shielding mesh made of electric cable and defines a plurality of honeycomb-shaped through holes. The size of the through holes is suited for preventing electromagnetic radiations from entering or leaving the cabinet 100.

The resilient member 88 is a clockwork spring, and includes a first positioning end 882 at an inner side of the resilient member 88, and a second positioning end 884 at an outer side of the resilient member 88.

Figure 4:
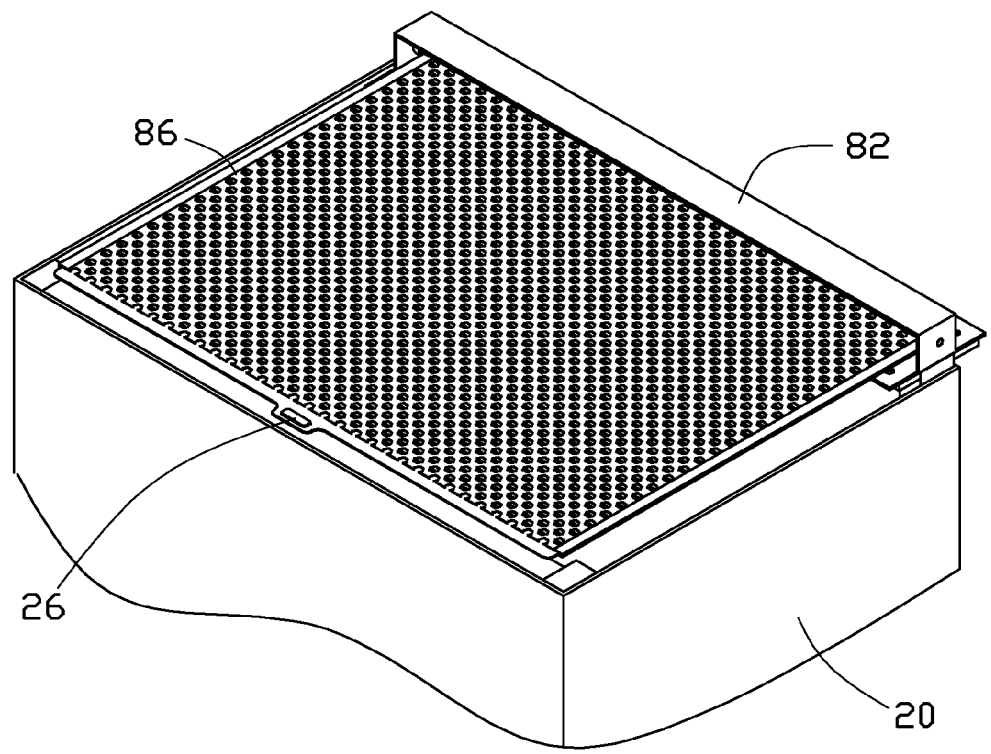
FIG. 4 is similar to FIG. 1, but showing the EMI shielding apparatus in use.

Referring to FIG. 4, in assembly, a second end of the shielding portion 861 opposite to the positioning bar 866 is fixed to the shaft 84. The shaft 84 is rotated to reel the shielding member 86 about the shaft 84. The resilient member 88 is fitted about the end of the shaft 84 defining the positioning hole 842. The first positioning end 882 of the resilient member 88 is latched in the positioning hole 842 of the shaft 84. A combination of the shaft 84, the shielding member 86, and the resilient member 88 is received in the receiving space 822 of the bracket 82. The ends of the shaft 84 are rotatably inserted in the shaft holes 824 of the bracket 82. The second positioning end 884 of the resilient member 88 is latched in the latching hole 827 of the bracket 82. The holder 869 extends out of the bracket 82 through an opening (not labeled) of the receiving space 822. The shielding member 86 can be wound on or let out from the shaft 84 as the shaft 84 rotates.

The EMI shielding apparatus 80 is attached to the chassis 20. Four fasteners (not shown) extend through the through holes 826 of the tabs 825, to be fastened to the first side of the top of the chassis 20 opposite to the latch 26. The receiving space 822 faces the latch 26, and the shielding member 86 abuts against the top of the chassis 20.

Referring to FIG. 4, in use, the holder 869 of the shielding member 86 is pulled out. The shaft 84 is rotated, thereby deforming the resilient member 88. The holder 869 is latched to the latch 26 of the chassis 20. Thus, the opening 24 is covered by the shielding member 86. When the server 40 needs to be repaired, the holder 869 is disengaged from the latch 26 of the chassis 20. The resilient member 88 is restored to bias the shaft 84 to rotate, and the shielding member 86 is withdrawn back into the receiving space 822 of the bracket 82.

Heat generated by the server 40 can be dissipated out of the chassis 20 through the through holes 868 of the shielding piece 862, and electromagnetic radiations cannot enter or leave the chassis 20 because of the misaligned through holes 868.

While the disclosure describes examples and embodiments, it is to be understood that the disclosure is not limited thereto. To the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electromagnetic interference (EMI) shielding apparatus, comprising:
 a bracket defining a receiving space;
 a shaft rotatably received in the receiving space; and
 a shielding member reeled about the shaft, and comprising a first end fixed to the shaft and a second end opposite to the first end; and
 a resilient member connected between the bracket and the shaft, wherein the resilient member is a clockwork spring, the clockwork spring fitting about the shaft, opposite ends of the clockwork spring respectively abut against the bracket and the shaft, the shielding member is made of EMI shielding material, and the shielding member is wound on or let out from the shaft as the shaft rotates;
 wherein the shielding member comprises a shielding portion; and
 wherein the shielding portion comprises two shielding pieces overlapped with each other, each shielding piece defines a plurality of through holes, and the through holes of one of the shielding pieces are misaligned from the through holes of the other shielding piece.

2. The EMI shielding apparatus of claim 1, wherein the bracket comprises a bottom wall, a top wall opposite to the bottom wall, and two end walls connected between ends of the top wall and the bottom wall, the end walls define two opposite shaft holes, two ends of the shaft are rotatably inserted in the shaft holes.

3. The EMI shielding apparatus of claim 2, wherein one of the end walls of the bracket defines a latching hole adjacent to the corresponding shaft hole, one end of the shaft defines a positioning hole, the resilient member comprises a first positioning end at an inner side of the resilient member and latched in the positioning hole of the shaft, and a second positioning end at an outer side of the resilient member and latched in the latching hole of the bracket.

4. The EMI shielding apparatus of claim 1, wherein the shielding member further comprises a positioning bar extending from a first end of the shielding portion, a holder is formed on the positioning bar, a second end of the shielding portion opposite to the positioning bar is fixed to the shaft.

5. The EMI shielding apparatus of claim 4, wherein two rims extend from opposite sides of the shielding portion, the rims are made of aluminum foil.

6. A cabinet, comprising:
 a chassis; and
 an electromagnetic interference (EMI) shielding apparatus comprising a bracket installed to a first end of the chassis, a shaft rotatably mounted to the bracket, a shielding member reeled about the shaft, and a resilient member connected between the bracket and the shaft, wherein the shielding member comprises a first end fixed to the shaft and a second end opposite to the first end, the second end forms a holder, a second end of the chassis forms a latch opposite to the bracket and detachably engages with the holder, the shielding member is made of EMI shielding material, and the shielding member is wound on or let out from the shaft as the shaft rotates;
 wherein the shielding member comprises a shielding portion; and
 wherein the shielding portion comprises two shielding pieces overlapped with each other, each of the shielding pieces defines a plurality of through holes, the through holes of one of the shielding piece are misaligned from the through holes of the other shielding piece.

7. The cabinet of claim 6, wherein the resilient member is a clockwork spring, the clockwork spring fitting about the shaft, opposite ends of the clockwork spring respectively abut against the bracket and the shaft.

8. The cabinet of claim 6, wherein the bracket comprises a bottom wall, a top wall opposite to the bottom wall, and two end walls connected between corresponding ends of the top wall and the bottom wall, the end walls define two opposite shaft holes, two ends of the shaft are rotatably inserted in the shaft holes.

9. The cabinet of claim 8, wherein one of the end walls of the bracket defines a latching hole adjacent to the corresponding shaft hole, one end of the shaft defines a positioning hole, the resilient member comprises a first positioning end at an inner side of the resilient member and latched in the positioning hole of the shaft, and a second positioning end at an outer side of the resilient member and latched in the latching hole of the bracket.

10. The cabinet of claim 6, wherein the shielding member further comprises two rims extending from two opposite sides of the shielding portion, and a position bar extending from a first end of the shielding portion, the holder is formed on the positioning bar, a second end of the shielding portion opposite to the positioning bar is fixed to the shaft.

11. The cabinet of claim 10, wherein two rims extend from opposite sides of the shielding portion, the rims are made of aluminum foil.

* * * * *